(12) United States Patent
Yoon et al.

(10) Patent No.: US 9,331,007 B2
(45) Date of Patent: May 3, 2016

(54) SEMICONDUCTOR DEVICE AND METHOD OF FORMING CONDUCTIVE INK LAYER AS INTERCONNECT STRUCTURE BETWEEN SEMICONDUCTOR PACKAGES

(71) Applicant: STATS ChipPAC, Ltd., Singapore (SG)

(72) Inventors: Insang Yoon, Gyeonggi-do (KR); Flynn Carson, Redwood City, CA (US); Il Kwon Shim, Singapore (SG); SeongHun Mun, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 171 days.

(21) Appl. No.: 13/653,242

(22) Filed: Oct. 16, 2012

(65) Prior Publication Data

US 2014/0103509 A1   Apr. 17, 2014

(51) Int. Cl.
*H01L 21/44* (2006.01)
*H01L 21/48* (2006.01)
*H01L 23/498* (2006.01)
(Continued)

(52) U.S. Cl.
CPC ........ *H01L 23/49816* (2013.01); *H01L 21/568* (2013.01); *H01L 23/49822* (2013.01); *H01L 23/49838* (2013.01); *H01L 23/49894* (2013.01); *H01L 23/5389* (2013.01); *H01L 25/105* (2013.01); *H01L 24/19* (2013.01); *H01L 24/20* (2013.01); *H01L 2224/0401* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/94* (2013.01); *H01L 2224/96* (2013.01); *H01L 2225/0651* (2013.01); *H01L 2225/06565* (2013.01); *H01L 2225/1023* (2013.01); *H01L 2225/1035* (2013.01); *H01L 2225/1041* (2013.01); *H01L 2225/1058* (2013.01); *H01L 2924/01322* (2013.01); *H01L 2924/12041* (2013.01); *H01L 2924/12042* (2013.01); *H01L 2924/13091* (2013.01); *H01L 2924/15311* (2013.01);
(Continued)

(58) Field of Classification Search
CPC ..................... H01L 23/3128; H01L 23/49816; H01L 24/81; H01L 24/97; H01L 25/1059
USPC .................. 257/686, 787, E23.021, E21.508; 438/618, 629, 613, 108, 109
See application file for complete search history.

(56) References Cited

U.S. PATENT DOCUMENTS 6,160,714 A * 12/2000 Green ............................ 361/761
6,759,268 B2 * 7/2004 Akagawa ...................... 438/106
(Continued)

*Primary Examiner* — Nitin Parekh
(74) *Attorney, Agent, or Firm* — Robert D. Atkins; Atkins and Associates, P.C.

(57) ABSTRACT

A semiconductor device has a semiconductor die with an encapsulant deposited over and around the semiconductor die. An opening is formed in a first surface of the encapsulant by etching or LDA. A plurality of bumps is optionally formed over the semiconductor die. A bump is recessed within the opening of the encapsulant. A conductive ink is formed over the first surface of the encapsulant, bump and sidewall of the opening. The conductive ink can be applied by a printing process. An interconnect structure is formed over a second surface of the encapsulant opposite the first surface of the encapsulant. The interconnect structure is electrically connected to the semiconductor die. A semiconductor package is disposed over the first surface of the encapsulant with a plurality of bumps electrically connected to the conductive ink layer. The semiconductor package may contain a memory device.

19 Claims, 17 Drawing Sheets

(51) Int. Cl.
*H01L 23/538* (2006.01)
*H01L 25/10* (2006.01)
*H01L 21/56* (2006.01)
*H01L 23/00* (2006.01)

(52) U.S. Cl.
CPC . *H01L2924/15331* (2013.01); *H01L 2924/181* (2013.01)

(56) References Cited

U.S. PATENT DOCUMENTS

| | | | |
|---|---|---|---|
| 7,345,361 B2 | 3/2008 | Mallik et al. | |
| 7,633,765 B1 | 12/2009 | Scanlan et al. | |
| 7,638,861 B2 | 12/2009 | Choi et al. | |
| 7,843,046 B2 | 11/2010 | Andrews, Jr. et al. | |
| 7,944,034 B2 | 5/2011 | Gerber et al. | |
| 7,964,963 B2 | 6/2011 | Momokawa | |
| 8,067,831 B2 | 11/2011 | Kwon et al. | |
| 8,076,765 B2 | 12/2011 | Chen et al. | |
| 8,183,696 B2 | 5/2012 | Meyer et al. | |
| 8,643,161 B2 * | 2/2014 | Hasegawa | 257/678 |
| 2008/0136004 A1 * | 6/2008 | Yang et al. | 257/686 |
| 2008/0142941 A1 | 6/2008 | Yew et al. | |
| 2008/0315385 A1 * | 12/2008 | Gerber | H01L 21/561 257/686 |
| 2009/0146301 A1 * | 6/2009 | Shimizu et al. | 257/738 |
| 2009/0293766 A1 | 12/2009 | Kamikoriyama et al. | |
| 2011/0068427 A1 | 3/2011 | Paek et al. | |
| 2011/0260334 A1 * | 10/2011 | Hasegawa | 257/774 |
| 2011/0278736 A1 | 11/2011 | Lin et al. | |
| 2012/0139090 A1 * | 6/2012 | Kim et al. | 257/659 |
| 2012/0168917 A1 | 7/2012 | Yim et al. | |
| 2013/0105991 A1 * | 5/2013 | Gan et al. | 257/777 |
| 2013/0154076 A1 * | 6/2013 | Camacho | H01L 21/4853 257/676 |
| 2013/0249106 A1 | 9/2013 | Lin et al. | |

* cited by examiner

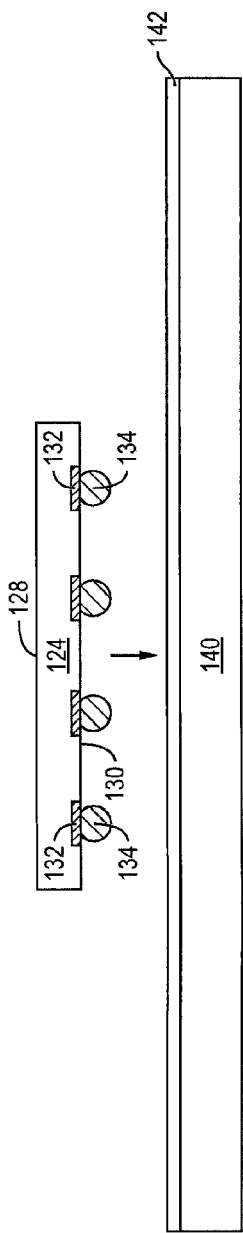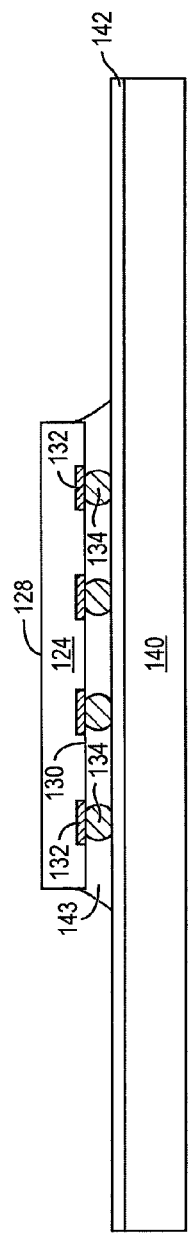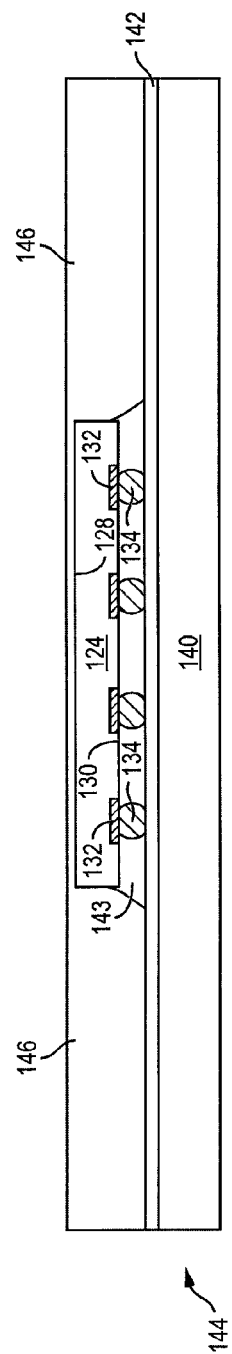

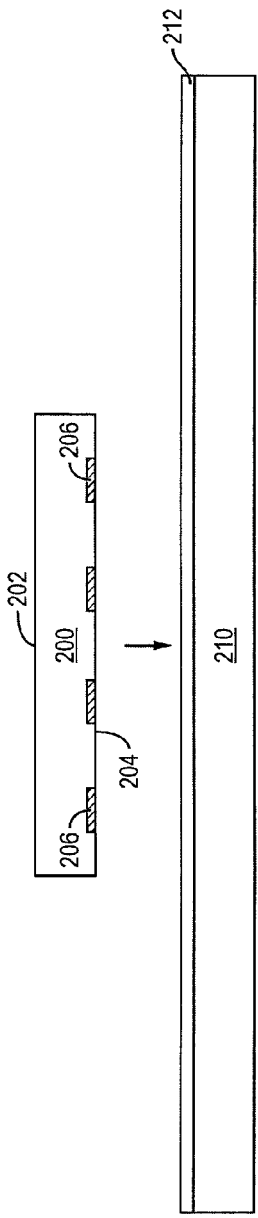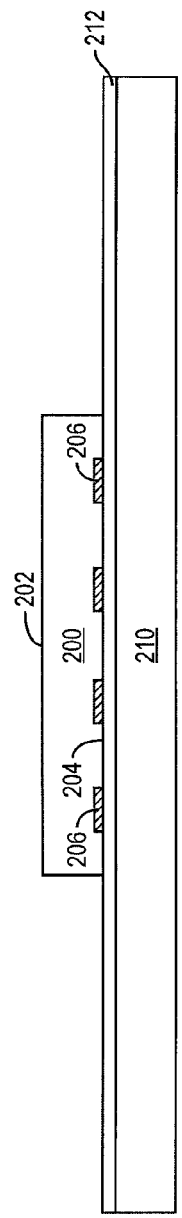

US 9,331,007 B2

SEMICONDUCTOR DEVICE AND METHOD OF FORMING CONDUCTIVE INK LAYER AS INTERCONNECT STRUCTURE BETWEEN SEMICONDUCTOR PACKAGES

FIELD OF THE INVENTION

The present invention relates in general to semiconductor devices and, more particularly, to a semiconductor device and method of forming a conductive ink layer as part of the interconnect structure between semiconductor packages.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A common semiconductor device arrangement includes a upper semiconductor package stacked over a lower semiconductor package, i.e. package-on-package (PoP). The upper semiconductor package is typically electrically connected to the lower semiconductor package with bumps. The interconnect bumps are bonded to an interconnect structure on the lower semiconductor package. The interconnect bumps add height to the PoP arrangement and can lead to warpage of the semiconductor device.

SUMMARY OF THE INVENTION

A need exists for an interconnect structure for PoP with reduced package height and better warpage control. Accordingly, in one embodiment, the present invention is a method of making a semiconductor device comprising the steps of providing a semiconductor die, depositing an encapsulant over and around the semiconductor die, forming an opening in a first surface of the encapsulant, forming a bump recessed within the opening of the encapsulant, forming a conductive ink over the first surface of the encapsulant, bump, and sidewall of the opening, and forming an interconnect structure over a second surface of the encapsulant opposite the first surface of the encapsulant.

In another embodiment, the present invention is a method of making a semiconductor device comprising the steps of providing a semiconductor die, depositing an encapsulant over the semiconductor die, forming an opening in a first surface of the encapsulant, forming a first interconnect structure recessed within the opening of the encapsulant, and forming a conductive layer over the first surface of the encapsulant and first interconnect structure.

In another embodiment, the present invention is a method of making a semiconductor device comprising the steps of providing a first semiconductor package including a recessed interconnect structure, and forming conductive ink over a surface of the first semiconductor package including the recessed interconnect structure.

In another embodiment, the present invention is a semiconductor device comprising a first semiconductor package including a recessed interconnect structure. Conductive ink is formed over a surface of the first semiconductor package including the recessed interconnect structure.

BRIEF DESCRIPTION OF THE DRAWINGS

FIGS. 4a-4l illustrate a process of forming a conductive ink layer as a package interconnect structure in fcPoP MLP; and FIGS. 5a-5l illustrate a process of forming a conductive ink layer as a package interconnect structure in eWLB MLP.

DETAILED DESCRIPTION OF THE DRAWINGS

Figure 1:
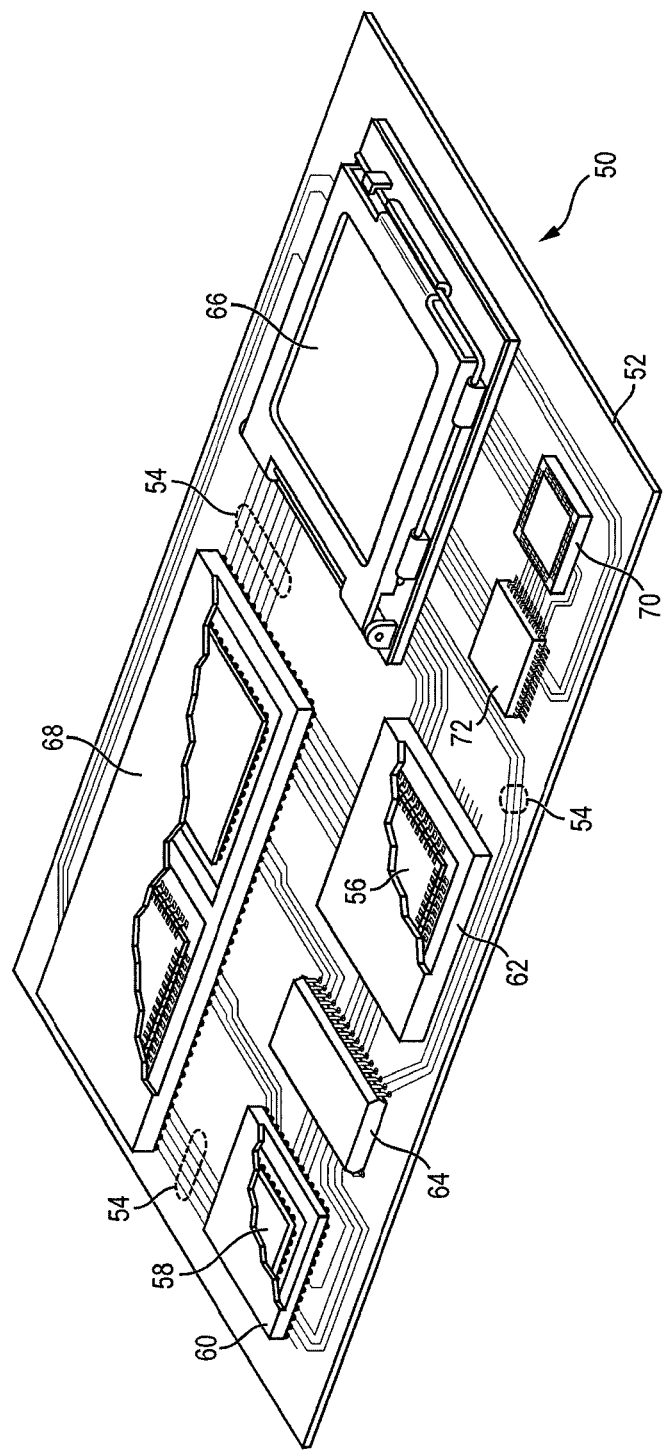
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Passive and active components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
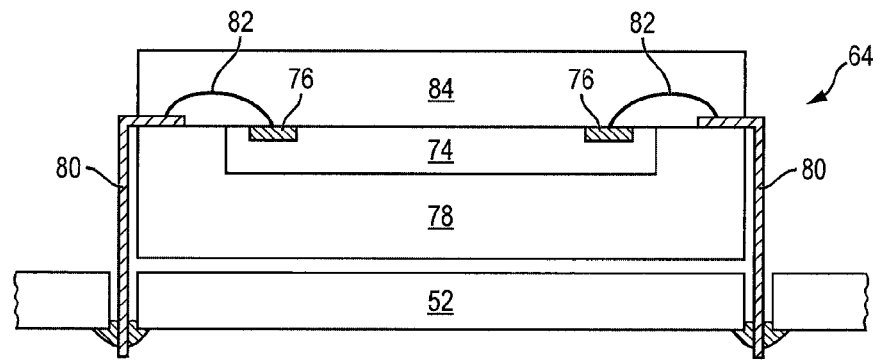
FIGS. 2a-2c illustrate further detail of the representative semiconductor packages mounted to the PCB.
Figure 2B:
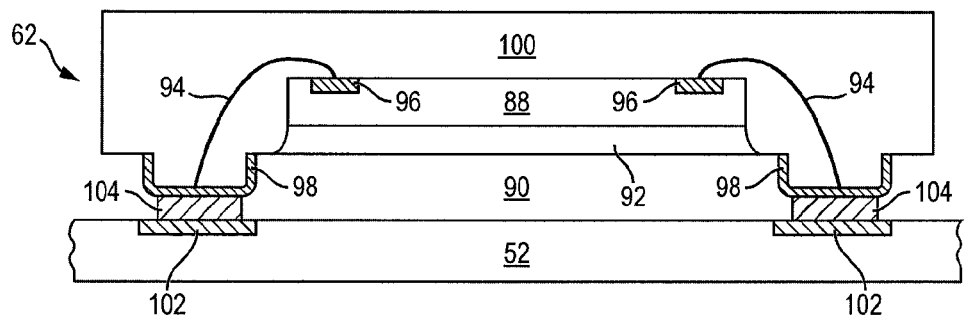
Figure 2C:
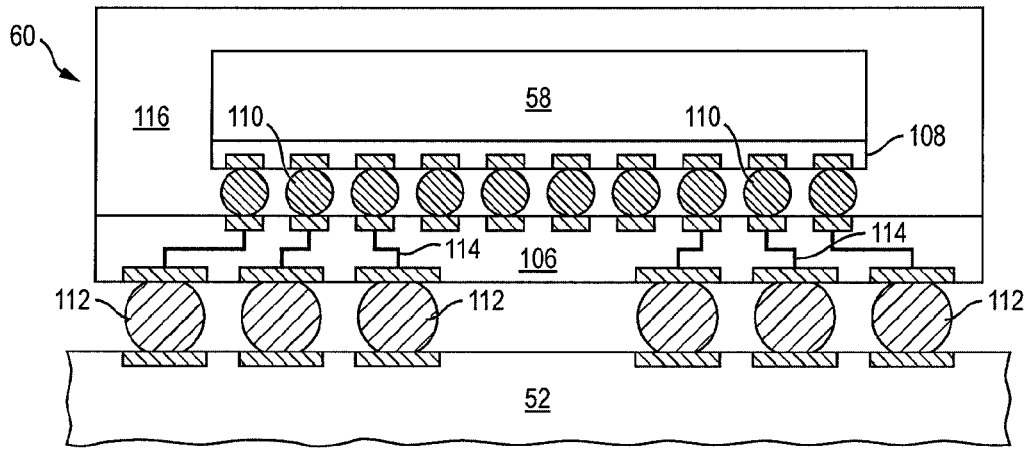

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
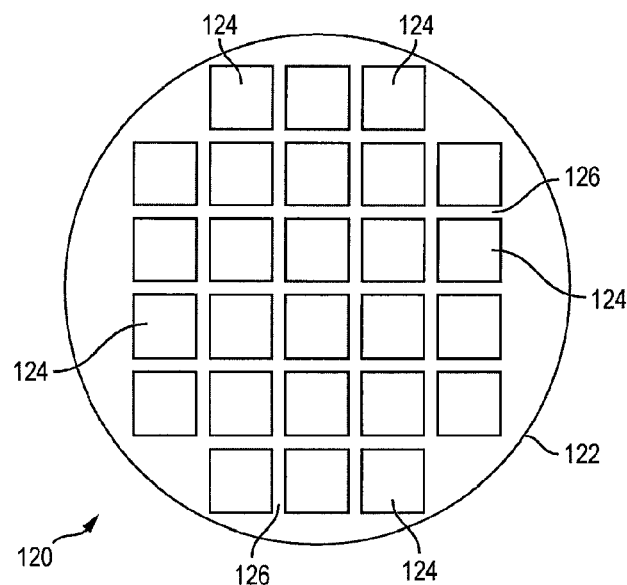
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
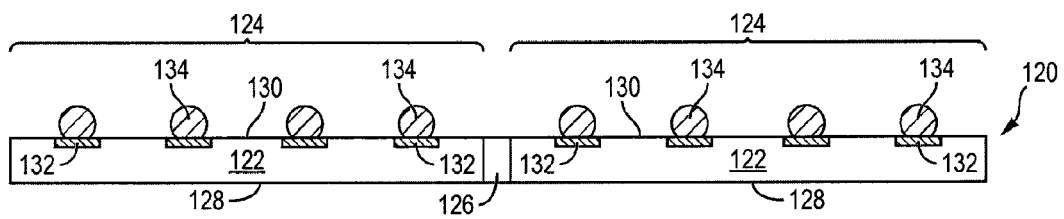

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as a digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, Ti, W, Pd, Pt, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form balls or bumps 134. In some applications, bumps 134 are reflowed a second time to improve electrical contact to conductive layer 132. Bumps 134 can also be compression bonded or thermocompression bonded to conductive layer 132. Bumps 134 represent one type of interconnect structure that can be formed over conductive layer 132. The interconnect structure can also use stud bump, micro bump, or other electrical interconnect.

Figure 3C:
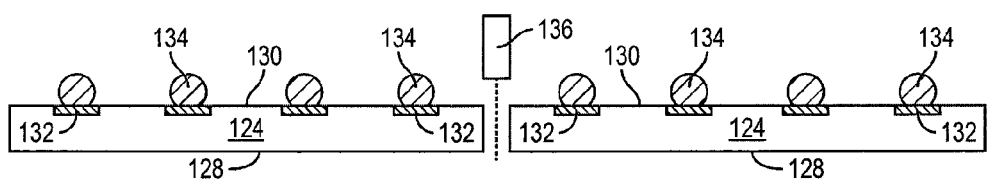

In FIG. 3c, semiconductor wafer 120 is singulated through saw street 126 using a saw blade or laser cutting tool 136 into individual flipchip type semiconductor die 124. Alternatively, singulation of semiconductor wafer 120 can be accomplished using a water jet to remove material within saw street 126.

Figure 4C:
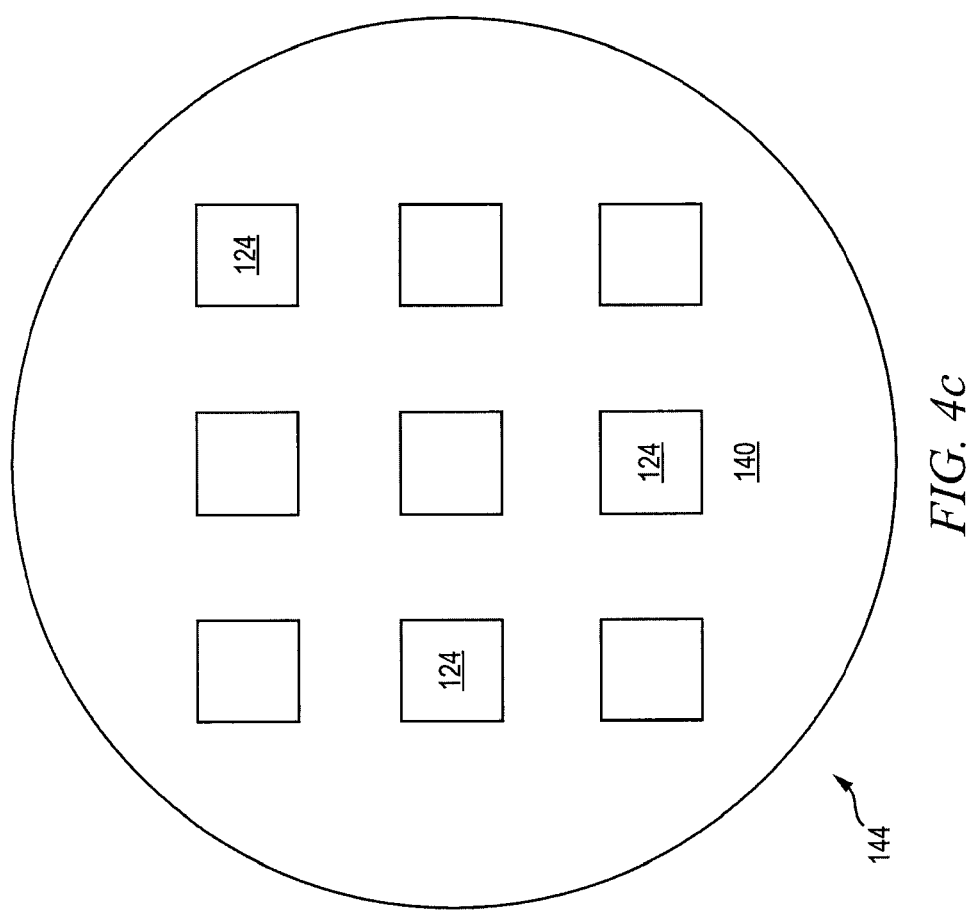

FIGS. 4a-4l illustrate, in relation to FIGS. 1 and 2a-2c, a process of forming a conductive ink layer as a package interconnect structure in fcPoP MLP. FIG. 4a shows a portion of substrate or carrier 140 containing temporary or sacrificial base material such as silicon, germanium, gallium arsenide, indium phosphide, silicon carbide, resin, beryllium oxide, glass, or other suitable low-cost, rigid material for structural support. An interface layer or double-sided tape 142 is formed over carrier 140 as a temporary adhesive bonding film, etch-stop layer, or release layer.

Semiconductor die 124 from FIGS. 3a-3c is positioned over and mounted to carrier 140 using a pick and place operation with bumps 134 oriented toward the carrier. FIG. 4b shows semiconductor die 124 mounted to carrier 140 with an underfill material 143, such as epoxy resin, disposed under the semiconductor die around bumps 134. Carrier 140 has sufficient area to hold many semiconductor die 124 as a reconstituted wafer 144. FIG. 4c shows a plan view of reconstituted wafer 144 with a plurality of semiconductor die 124 mounted to carrier 140.

In FIG. 4d, an encapsulant or molding compound 146 is deposited over semiconductor die 124 and carrier 140 using a paste printing, compressive molding, transfer molding, liquid encapsulant molding, vacuum lamination, spin coating, or other suitable applicator. Encapsulant 146 can be one or more layers of polymer composite material, such as epoxy resin with filler, epoxy acrylate with filler, or polymer with proper filler. Encapsulant 146 is non-conductive and environmentally protects the semiconductor device from external elements and contaminants.

Figure 4E:
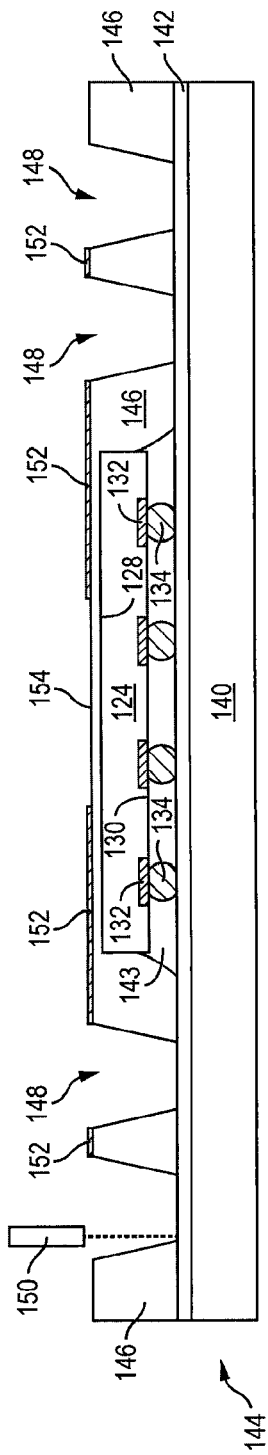

In FIG. 4e, a portion of encapsulant 146 is removed by an etching process through a photoresist layer to form patterned openings 148 extending down to interface layer 142 of carrier 140. Alternatively, openings 148 can be formed by laser direct ablation (LDA) using laser 150.

Figure 4F:
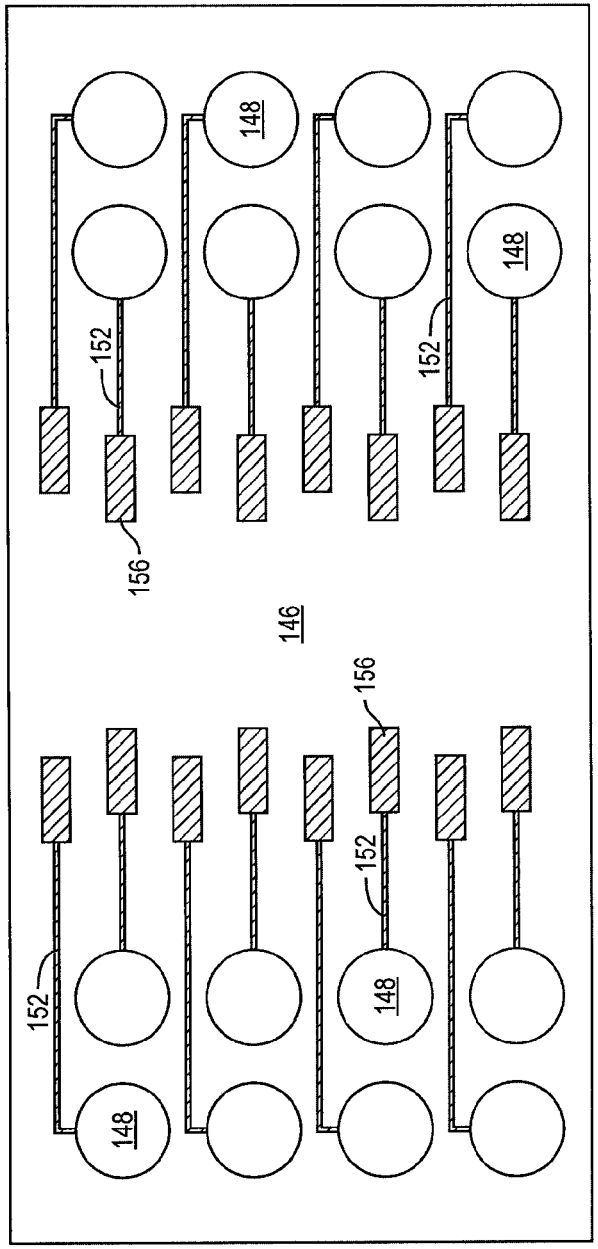

An electrically conductive layer 152 is formed over surface 154 of encapsulant 146 using a printing process. Conductive layer 152 can be one or more layers of Al, Cu, Sn, Ni, Au, Ag, Ti, W, Pd, Pt, iridium, osmium, or other suitable electrically conductive material. In one embodiment, conductive layer 152 is formed as a conductive ink layer containing powdered or flaked silver, carbon, n-type semiconductor material, or other conductive printable materials using a printing process. FIG. 4f shows a plan view of conductive layer 152 extending from location 156 on surface 154 of encapsulant 146, suitable for mounting a semiconductor package, to openings 148.

Figure 4G:
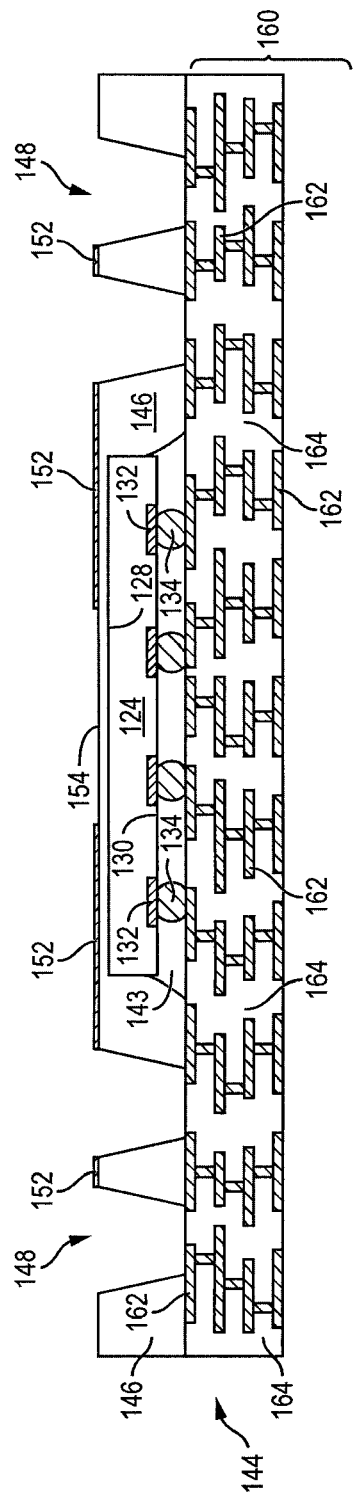

In FIG. 4g, carrier 140 and interface layer 142 are removed by chemical etching, mechanical peel-off, CMP, mechanical grinding, thermal bake, laser scanning, or wet stripping to expose bumps 134, encapsulant 146, and openings 148. A build-up interconnect structure 160 is formed over encapsulant 146, openings 148, semiconductor die 124, and bumps 134. The build-up interconnect structure 160 includes an electrically conductive layer or redistribution layer (RDL) 162 formed using a patterning and metal deposition process such as sputtering, electrolytic plating, and electroless plating. Conductive layer 162 can be one or more layers of Al, Cu, Sn, Ni, Au, Ag, or other suitable electrically conductive material. Conductive layer 162 is electrically connected to bumps 134. Other portions of conductive layer 162 can be electrically common or electrically isolated depending on the design and function of semiconductor die 124.

The build-up interconnect structure 160 further includes an insulating or passivation layer 164 formed between conductive layer 162 for electrical isolation using PVD, CVD, printing, spin coating, spray coating, sintering or thermal oxidation. The insulating layer 164 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties.

Figure 4H:
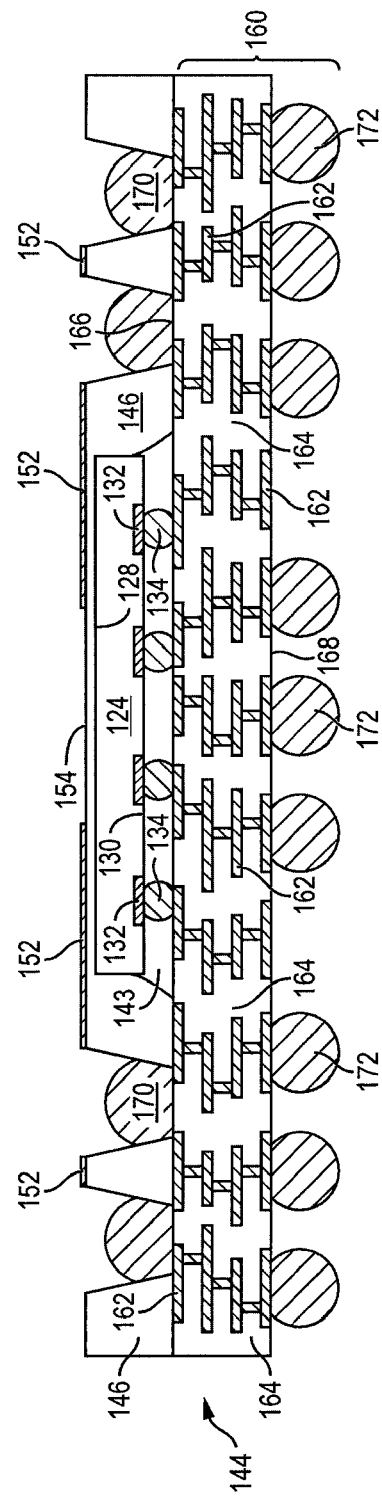

In FIG. 4h, an electrically conductive bump material is deposited into openings 148 of encapsulant 146 and electrically connected to conductive layer 162 on surface 166 using an evaporation, electrolytic plating, electroless plating, ball drop, or screen printing process. An electrically conductive bump material is further deposited over build-up interconnect structure 160 and electrically connected to conductive layer 162 on surface 168 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form balls or bumps 170 and 172. In some applications, bumps 170-172 are reflowed a second time to improve electrical contact to conductive layer 162. Bumps 170 are recessed within openings 148 with respect to surface 154 of encapsulant 146. An under bump metallization (UBM) layer can be formed under bumps 170-172. Bumps 170-172 can also be compression bonded to conductive layer 162. Bumps 170-172 represent one type of interconnect structure that can be formed over conductive layer 162. The interconnect structure can also use bond wires, stud bump, micro bump, or other electrical interconnect.

Figure 4I:
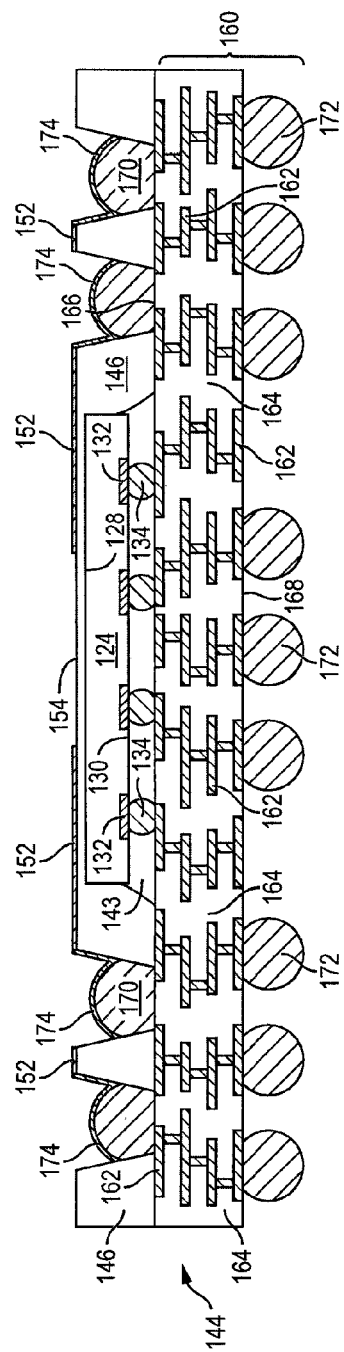
Figure 4J:
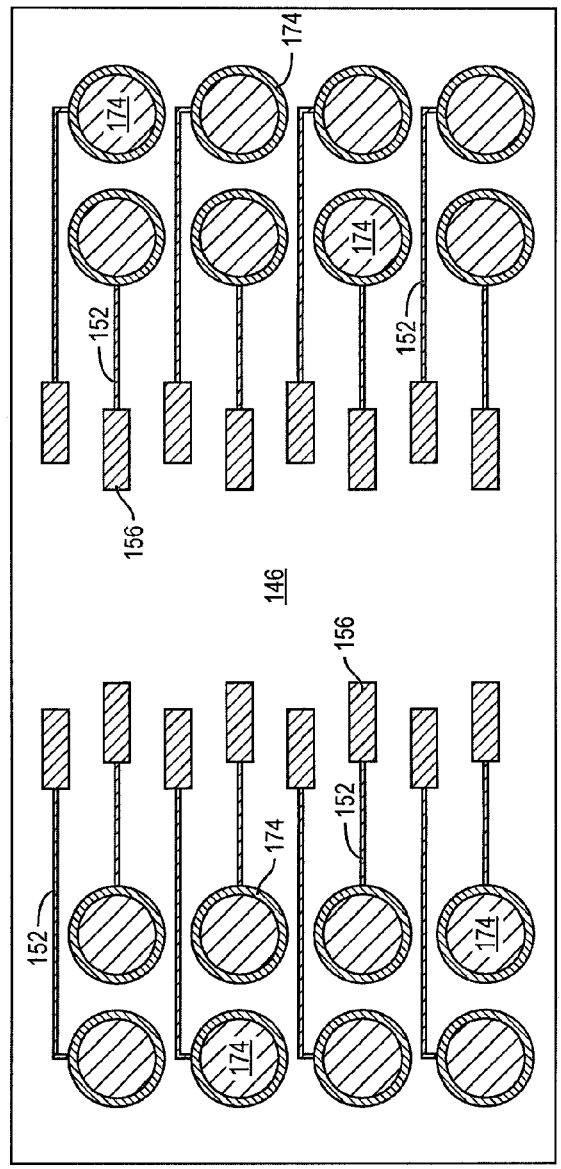

In FIG. 4i, an electrically conductive layer 174 is conformally applied over recessed bumps 170 and sidewalls of openings 148 using a printing process. Conductive layer 174 can be one or more layers of Al, Cu, Sn, Ni, Au, Ag, Ti, W, Pd, Pt, iridium, osmium, or other suitable electrically conductive material. In one embodiment, conductive layer 174 is formed as a conductive ink layer containing powdered or flaked silver, carbon, n-type semiconductor material, or other conductive printable materials using a printing process to conformally cover recessed bumps 170 and the sidewalls of openings 148. Conductive layer 174 is electrically connected to conductive layer 152. FIG. 4j shows a plan view of conductive layer 174 printed over recessed bumps 170 and openings 148 extending to conductive layer 152.

Alternatively, conductive ink layers 152 and 174 are printed as a continuous ink layer during the same processing sequence over surface 154 of encapsulant 146, recessed bumps 170, and the sidewalls of openings 148, as shown in FIGS. 4i and 4j.

Figure 4K:
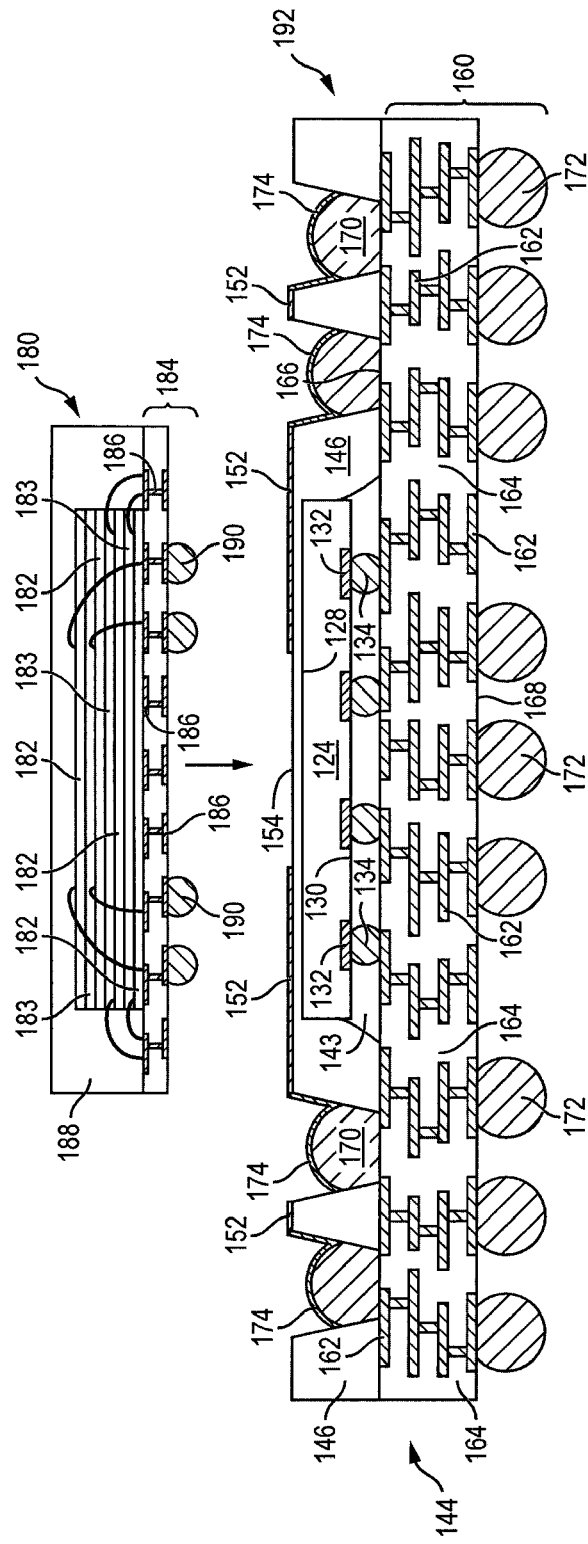

FIG. 4k shows a semiconductor package 180 containing a plurality of stacked semiconductor die 182. Each semiconductor die 182 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as a DSP, ASIC, memory, or other signal processing circuit. Semiconductor die 182 may also contain IPDs, such as inductors, capacitors, and resistors, for RF signal processing. Semiconductor die 182 are bonded together with die attach adhesive 183, such as epoxy resin. In one embodiment, semiconductor die 182 are stacked memory modules and semiconductor die 124 is a memory controller, DSP, or other microprocessor.

The stacked semiconductor die 182 are mounted to substrate 184 and electrically connected to conductive layer 186 within substrate 184 by bond wires or conductive vias. An encapsulant 188 is deposited over semiconductor die 182 and substrate 184. Alternatively, encapsulant 188 is formed over the stacked semiconductor die 182 prior to forming substrate 184, and the substrate is then formed over the stacked semiconductor die and encapsulant. Bumps 190 are formed over a surface of substrate 184 opposite semiconductor die 182 and electrically connected to conductive layer 186.

Figure 4L:
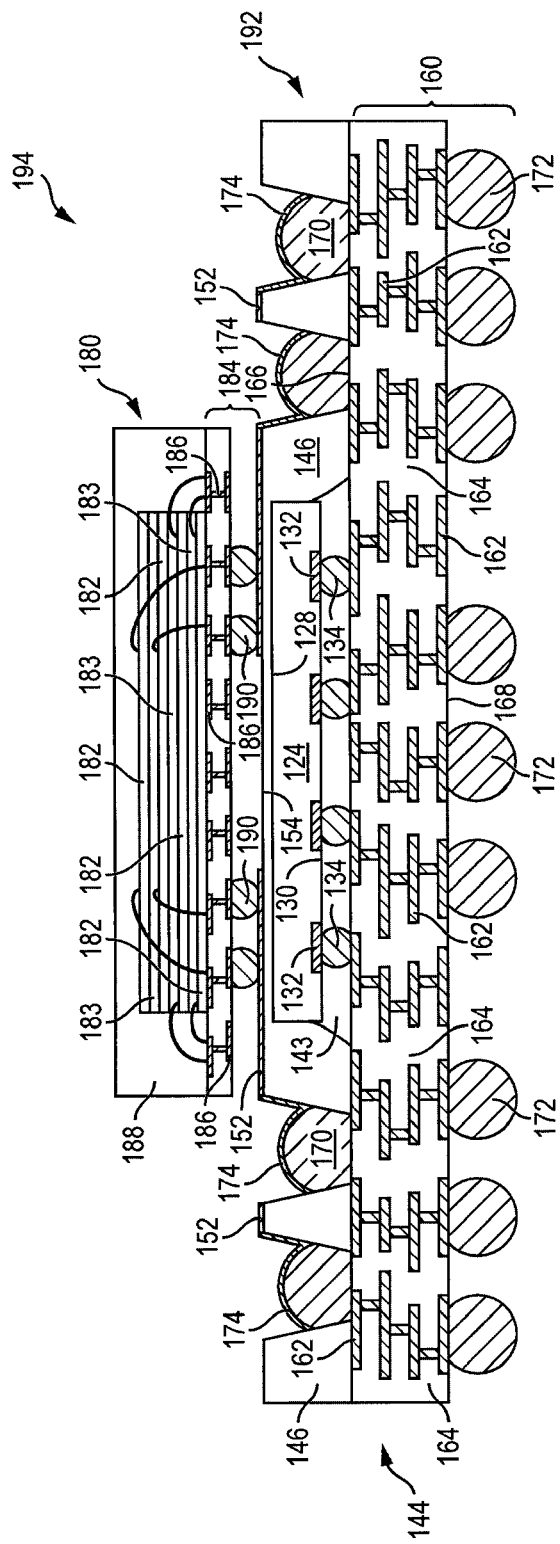

A flipchip semiconductor package 192 contains semiconductor die 124 covered by encapsulant 146 and connected to build-up interconnect structure 160. Bumps 170 are recessed within openings 148 of encapsulant 146. Conductive ink layer 152 is formed over surface 154 and conductive ink layer 174 is formed over recessed bumps 170 and openings 148. Semiconductor package 180 is positioned over and mounted to flipchip semiconductor package 192 using a pick and place operation with bumps 190 electrically connected to conductive layer 152. FIG. 4l shows semiconductor package 180 mounted to semiconductor package 192. Reconstituted wafer 144 is singulated through encapsulant 146 and build-up interconnect structure 160 using a saw blade or laser cutting tool into individual flipchip package-on-package (fcPoP) molded leadless package (MLP) 194.

The stacked semiconductor die 182 in semiconductor package 180 are electrically connected through conductive layer 186 and bumps 190 to conductive layer 152 in flipchip semiconductor package 192. The stacked semiconductor die 182 are further connected through conductive layer 152, conductive layer 174, bumps 170, conductive layer 162, and bumps 134 to semiconductor die 124 in flipchip semiconductor package 192. Conductive layers 152 and 174 are implemented as printed conductive ink layers to electrically connect bumps 190 in semiconductor package 180 to recessed bumps 170 in flipchip semiconductor package 192. Accordingly, conductive ink layers 152 and 174 over bumps 170 form part of the interconnect structure between semiconductor package 180 and flipchip semiconductor package 192. The printed conductive ink layers 152 and 174 in fcPoP MLP 194 reduces package height and warpage for semiconductor packages 180 and 192 while providing high density interconnect and shorter signal path.

Figure 5C:
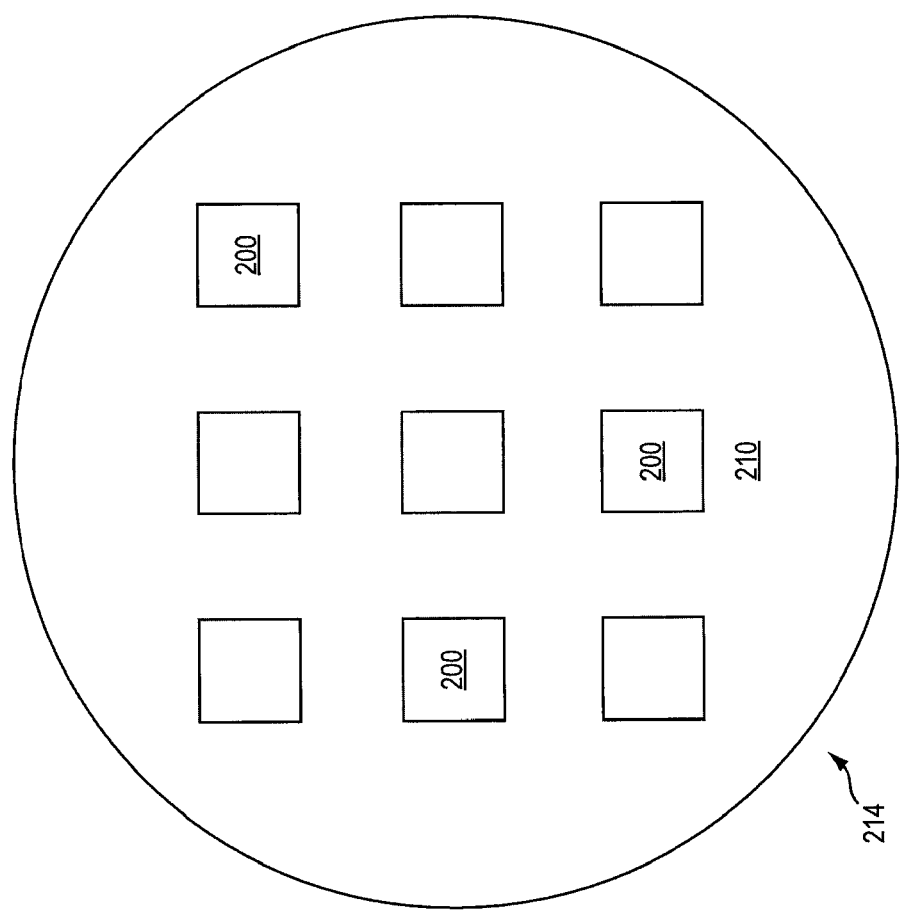

FIGS. 5a-5l illustrate, in relation to FIGS. 1 and 2a-2c, a process of forming a conductive ink layer as a package interconnect structure in an embedded wafer level ball grid array (eWLB) MLP. FIG. 5a shows semiconductor die 200 singulated from a semiconductor wafer, similar to FIGS. 3a-3c, with a back surface 202 and active surface 204 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 204 to implement analog circuits or digital circuits, such as a DSP, ASIC, memory, or other signal processing circuit. Semiconductor die 200 may also contain IPDs, such as inductors, capacitors, and resistors, for RF signal processing.

An electrically conductive layer 206 is formed over active surface 204 using PVD, CVD, electrolytic plating, electroless plating process, or other suitable metal deposition process. Conductive layer 206 can be one or more layers of Al, Cu, Sn, Ni, Au, Ag, Ti, W, Pd, Pt, or other suitable electrically conductive material. Conductive layer 206 operates as contact pads electrically connected to the circuits on active surface 204. Conductive layer 206 can be formed as contact pads disposed side-by-side a first distance from the edge of semiconductor die 200. Alternatively, conductive layer 206 can be formed as contact pads that are offset in multiple rows such that a first row of contact pads is disposed a first distance from the edge of the die, and a second row of contact pads alternating with the first row is disposed a second distance from the edge of the die.

A substrate or carrier 210 contains temporary or sacrificial base material such as silicon, germanium, gallium arsenide, indium phosphide, silicon carbide, resin, beryllium oxide, glass, or other suitable low-cost, rigid material for structural support. An interface layer or double-sided tape 212 is formed over carrier 210 as a temporary adhesive bonding film, etch-stop layer, or release layer.

Semiconductor die 200 is positioned over and mounted to carrier 210 using a pick and place operation with active surface 204 oriented toward the carrier. FIG. 5b shows semiconductor die 200 mounted to a portion of carrier 210. Carrier 210 has sufficient area to hold many semiconductor die 200 as a reconstituted wafer 214. FIG. 5c shows a plan view of reconstituted wafer 214 with a plurality of semiconductor die 200 mounted to carrier 210.

In FIG. 5d, an encapsulant or molding compound 216 is deposited over semiconductor die 200 and carrier 210 using a paste printing, compressive molding, transfer molding, liquid encapsulant molding, vacuum lamination, spin coating, or other suitable applicator. Encapsulant 216 can be one or more layers of polymer composite material, such as epoxy resin with filler, epoxy acrylate with filler, or polymer with proper filler. Encapsulant 216 is non-conductive and environmentally protects the semiconductor device from external elements and contaminants.

Figure 5E:
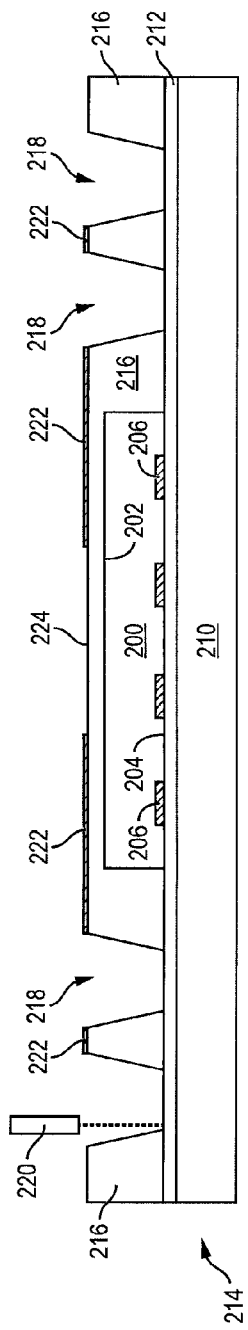

In FIG. 5e, a portion of encapsulant 216 is removed by an etching process through a photoresist layer to form patterned openings 218 extending down to interface layer 212 of carrier 210. Alternatively, openings 218 can be formed by LDA using laser 220.

Figure 5F:
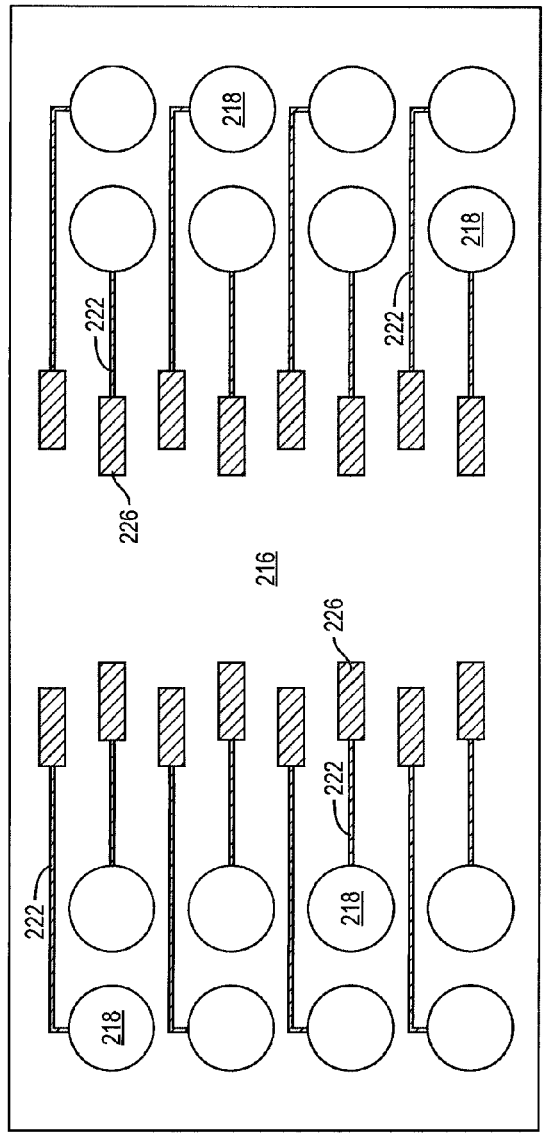

An electrically conductive layer 222 is formed over surface 224 of encapsulant 216 using a printing process. Conductive layer 222 can be one or more layers of Al, Cu, Sn, Ni, Au, Ag, Ti, W, Pd, Pt, iridium, osmium, or other suitable electrically conductive material. In one embodiment, conductive layer 222 is formed as a conductive ink layer containing powdered or flaked silver, carbon, n-type semiconductor material, or other conductive printable materials using a printing process. FIG. 5f shows a plan view of conductive layer 222 extending from location 226 on surface 224 of encapsulant 216, suitable for mounting a semiconductor package, to openings 218.

Figure 5G:
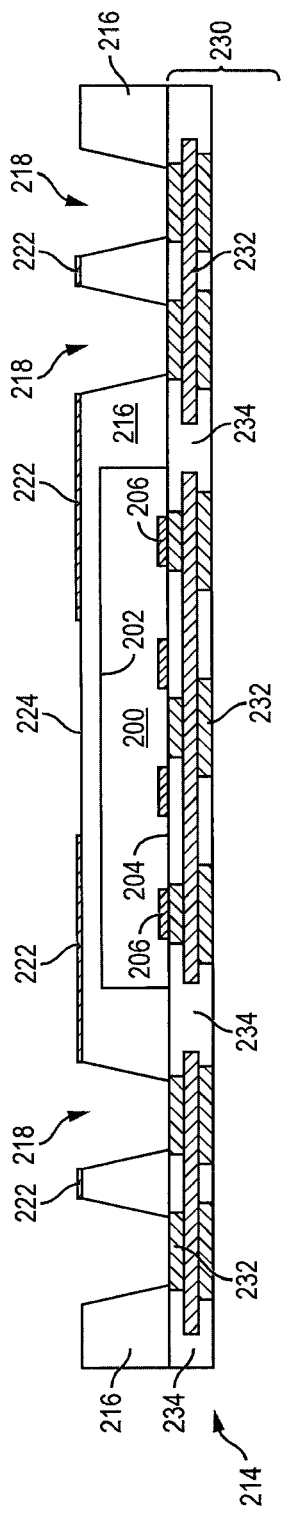

In FIG. 5g, carrier 210 and interface layer 212 are removed by chemical etching, mechanical peel-off, CMP, mechanical grinding, thermal bake, laser scanning, or wet stripping to semiconductor die 200, conductive layer 206, encapsulant 216, and openings 218. A build-up interconnect structure 230 is formed over encapsulant 216, openings 218, and semiconductor die 200. The build-up interconnect structure 230 includes an electrically conductive layer or RDL 232 formed using a patterning and metal deposition process such as sputtering, electrolytic plating, and electroless plating. Conductive layer 232 can be one or more layers of Al, Cu, Sn, Ni, Au, Ag, or other suitable electrically conductive material. Conductive layer 232 is electrically connected to conductive layer 206. Other portions of conductive layer 232 can be electrically common or electrically isolated depending on the design and function of semiconductor die 200.

The build-up interconnect structure 230 further includes an insulating or passivation layer 234 formed between conductive layer 232 for electrical isolation using PVD, CVD, printing, spin coating, spray coating, sintering or thermal oxidation. The insulating layer 234 contains one or more layers of SiO2, Si3N4, SiON, Ta2O5, Al2O3, or other material having similar insulating and structural properties.

Figure 5H:
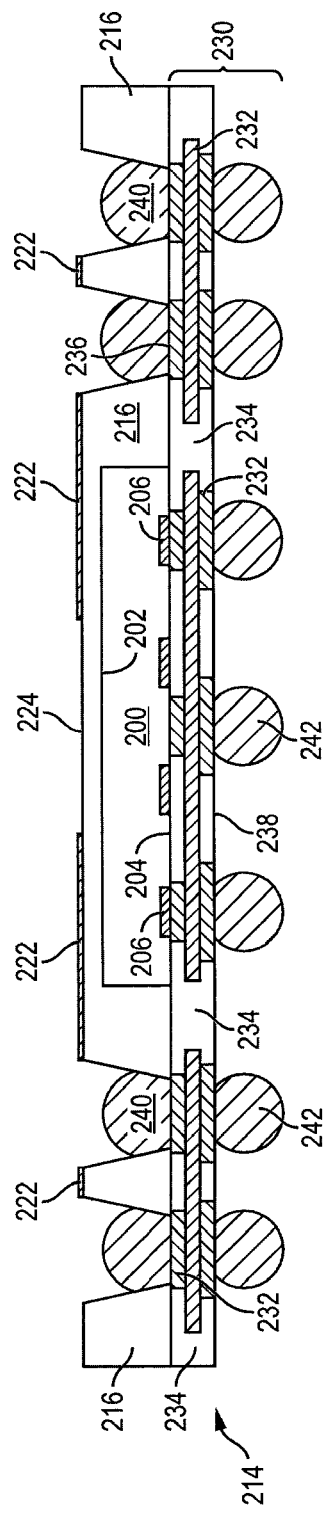

In FIG. 5h, an electrically conductive bump material is deposited into openings 218 of encapsulant 216 and electrically connected to conductive layer 232 on surface 236 using an evaporation, electrolytic plating, electroless plating, ball drop, or screen printing process. An electrically conductive bump material is further deposited over build-up interconnect structure 230 and electrically connected to conductive layer 232 on surface 238 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 232 using a suitable attachment or bonding process. In one embodiment, the bump material is reflowed by heating the material above its melting point to form balls or bumps 240 and 242. In some applications, bumps 240-242 are reflowed a second time to improve electrical contact to conductive layer 232. Bumps 240 are recessed within openings 218 with respect to surface 224 of encapsulant 216. A UBM layer can be formed under bumps 240-242. Bumps 240-242 can also be compression bonded to conductive layer 232. Bumps 240-242 represent one type of interconnect structure that can be formed over conductive layer 232. The interconnect structure can also use bond wires, stud bump, micro bump, or other electrical interconnect.

Figure 5I:
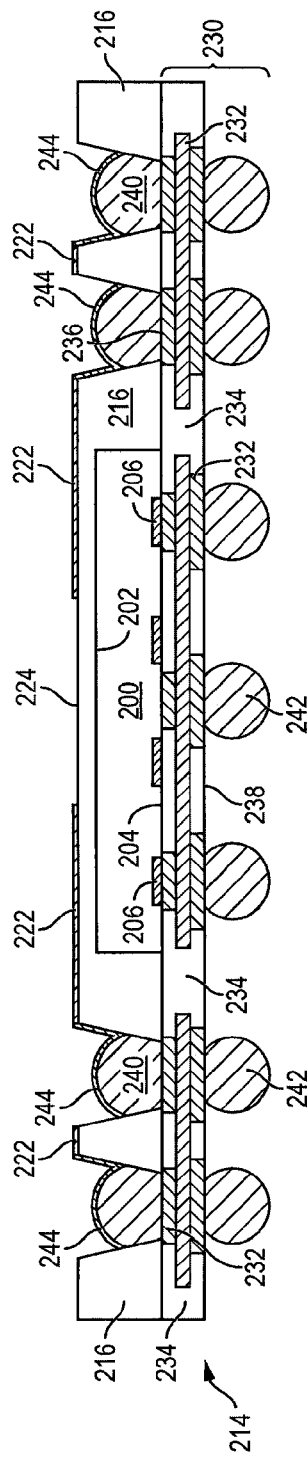
Figure 5J:
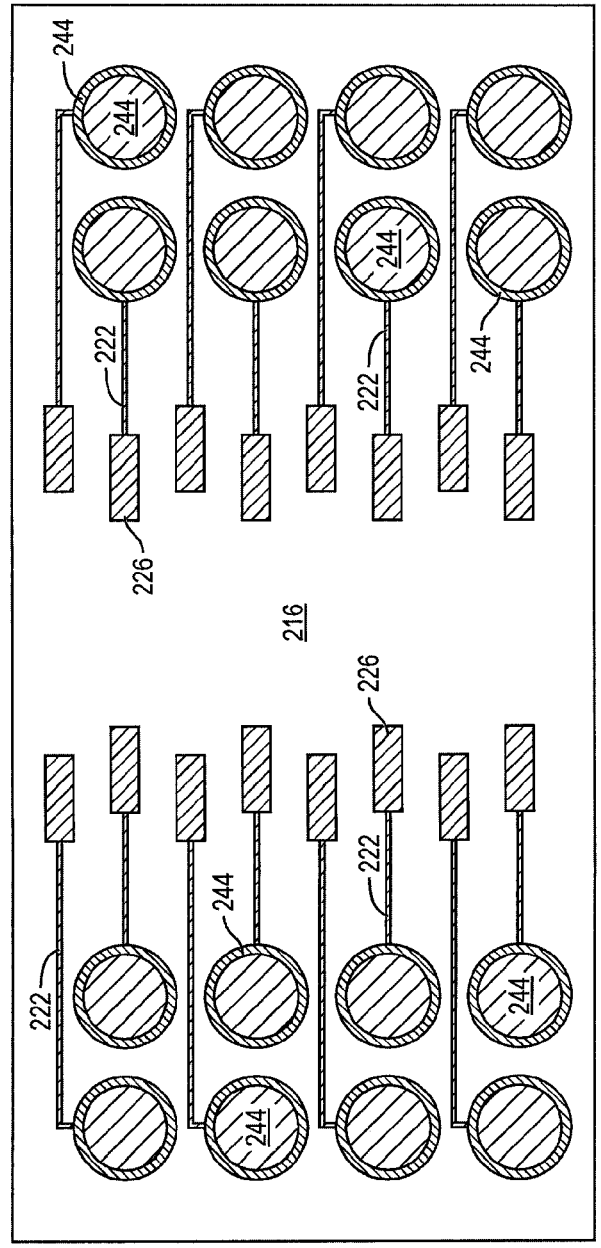

In FIG. 5i, an electrically conductive layer 244 is conformally applied over recessed bumps 240 and sidewalls of openings 218 using a printing process. Conductive layer 244 can be one or more layers of Al, Cu, Sn, Ni, Au, Ag, Ti, W, Pd, Pt, iridium, osmium, or other suitable electrically conductive material. In one embodiment, conductive layer 244 is formed as a conductive ink layer containing powdered or flaked silver, carbon, n-type semiconductor material, or other conductive printable materials using a printing process to conformally cover recessed bumps 240 and the sidewalls of openings 218. Conductive layer 244 is electrically connected to conductive layer 222. FIG. 5j shows a plan view of conductive layer 244 printed over recessed bumps 240 and openings 218 extending to conductive layer 222.

Alternatively, conductive ink layers 222 and 244 are printed as a continuous ink layer during the same processing sequence over surface 224 of encapsulant 216, recessed bumps 240, and the sidewalls of openings 218, as shown in FIGS. 5i and 5j.

Figure 5K:
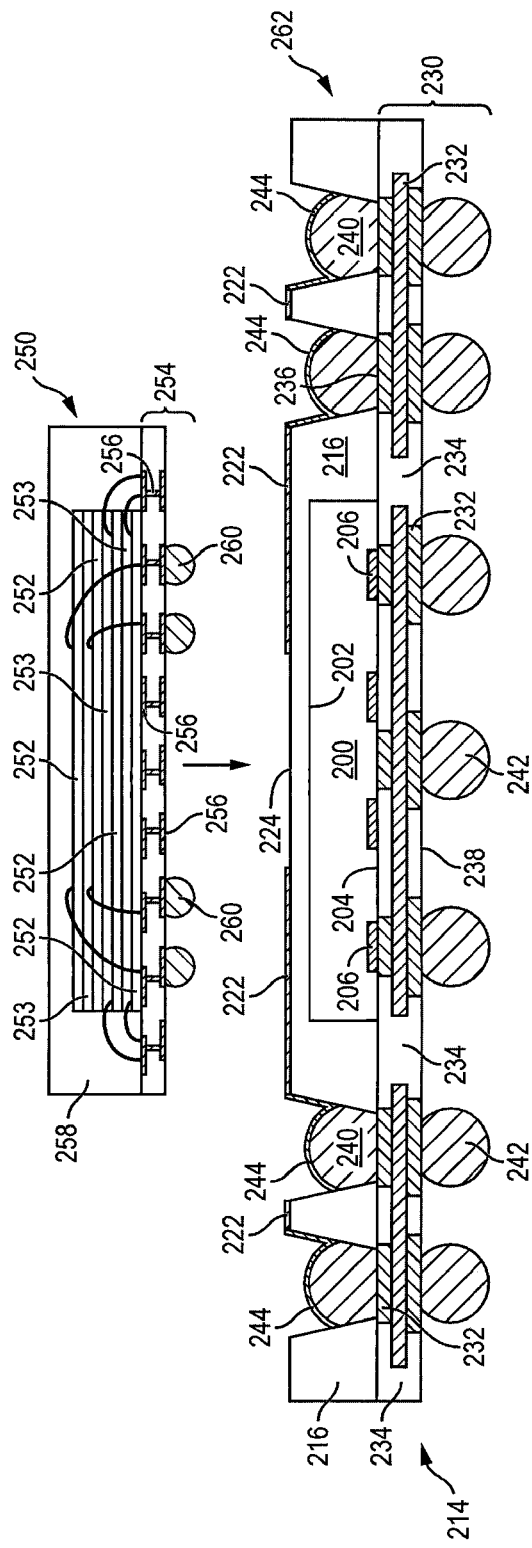

FIG. 5k shows a semiconductor package 250 containing a plurality of stacked semiconductor die 252. Each semiconductor die 252 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as a DSP, ASIC, memory, or other signal processing circuit. Semiconductor die 252 may also contain IPDs, such as inductors, capacitors, and resistors, for RF signal processing. Semiconductor die 252 are bonded together with die attach adhesive 253, such as epoxy resin. In one embodiment, semiconductor die 252 are stacked memory modules and semiconductor die 200 is a memory controller, DSP, or other microprocessor.

The stacked semiconductor die 252 are mounted to substrate 254 and electrically connected to conductive layer 256 within substrate 254 by bond wires or conductive vias. An encapsulant 258 is deposited over semiconductor die 252 and substrate 254. Alternatively, encapsulant 258 is formed over the stacked semiconductor die 252 prior to forming substrate 254, and the substrate is then formed over the stacked semiconductor die and encapsulant. Bumps 260 are formed over a surface of substrate 254 opposite semiconductor die 252 and electrically connected to conductive layer 256.

Figure 5L:
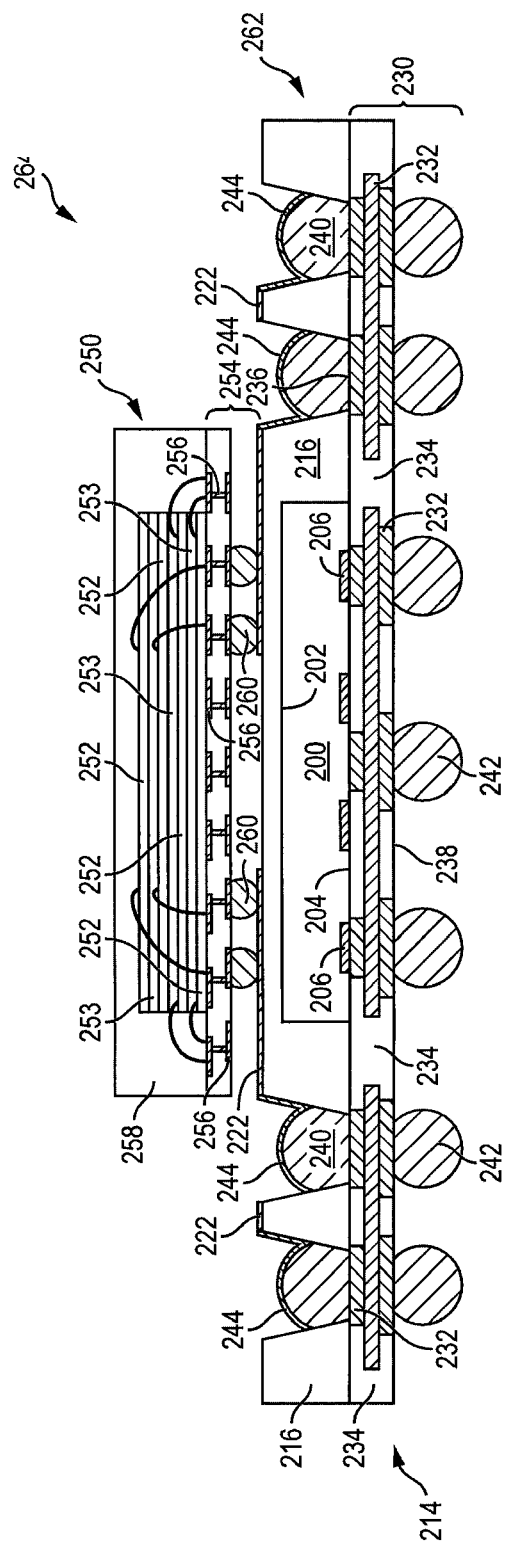

An eWLB semiconductor package 262 contains semiconductor die 200 covered by encapsulant 216 and connected to build-up interconnect structure 230. Bumps 240 are recessed within openings 218 of encapsulant 216. Conductive ink layer 222 is formed over surface 224 and conductive ink layer 244 is formed over recessed bumps 240 and openings 218. Semiconductor package 250 is positioned over and mounted to eWLB semiconductor package 262 using a pick and place operation with bumps 260 electrically connected to conductive layer 222. FIG. 5l shows semiconductor package 250 mounted to semiconductor package 262. Reconstituted wafer 214 is singulated through encapsulant 216 and build-up interconnect structure 230 using a saw blade or laser cutting tool into individual eWLB MLP 264.

The stacked semiconductor die 252 in semiconductor package 250 are electrically connected through conductive layer 256 and bumps 260 to conductive layer 222 in eWLB semiconductor package 262. The stacked semiconductor die 252 are further connected through conductive layer 222, conductive layer 244, bumps 240 and conductive layer 232 to semiconductor die 200 in eWLB semiconductor package 262. Conductive layers 222 and 244 are implemented as printed conductive ink layers to electrically connect bumps 260 in semiconductor package 250 to recessed bumps 240 in eWLB semiconductor package 262. Accordingly, conductive ink layers 222 and 244 over bumps 240 form part of the interconnect structure between semiconductor package 250 and eWLB semiconductor package 262. The printed conductive ink layers 222 and 244 in fcPoP MLP 264 reduces package height and warpage for semiconductor packages 250 and 262 while providing high density interconnect and shorter signal path.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    depositing an encapsulant over the semiconductor die;
    forming an opening in a first surface of the encapsulant;
    forming a conductive layer over a portion of the first surface of the encapsulant;
    forming a bump in the opening of the encapsulant;
    conformally printing a conductive ink layer over the bump and a sidewall of the opening and extending to the conductive layer; and
    forming an interconnect structure over a second surface of the encapsulant opposite the first surface of the encapsulant.

2. The method of claim 1, further including disposing a semiconductor package over the first surface of the encapsulant.

3. The method of claim 2, further including forming a plurality of bumps over the semiconductor package to electrically connect the semiconductor package to the conductive ink layer.

4. The method of claim 2, wherein the semiconductor package includes a memory device.

5. The method of claim 1, further including forming a plurality of bumps over the semiconductor die.

6. A method of making a semiconductor device, comprising:
    providing a semiconductor die;
    depositing an encapsulant over the semiconductor die;
    forming an opening in a first surface of the encapsulant;
    forming a first interconnect structure in the opening of the encapsulant; and
    printing a conductive ink layer including a nonlinear surface over the first interconnect structure and within the opening, the conductive ink layer terminating at the first surface of the encapsulant.

7. The method of claim 6, further including forming a second interconnect structure over a second surface of the encapsulant opposite the first surface of the encapsulant.

8. The method of claim 6, wherein the first interconnect structure includes a bump.

9. The method of claim 6, further including disposing a semiconductor package over the first surface of the encapsulant.

10. The method of claim 9, further including forming a bump over the semiconductor package to electrically connect the semiconductor package to the conductive ink layer.

11. The method of claim 6, further including forming a plurality of bumps over the semiconductor die.

12. The method of claim 6, further including forming a conductive trace over the first surface of the encapsulant between the semiconductor die and the opening.

13. A method of making a semiconductor device, comprising:
    providing a first semiconductor package including an opening;
    forming a recessed interconnect structure within the opening; and
    printing a conductive ink over the recessed interconnect structure and a first portion of a sidewall of the opening while leaving a second portion of the sidewall of the opening devoid of the conductive ink and the recessed interconnect structure.

14. The method of claim 13, wherein providing the first semiconductor package includes:
    providing a semiconductor die;
    depositing an encapsulant over the semiconductor die; and
    forming the opening in the encapsulant.

15. The method of claim 14, further including forming a plurality of bumps over the semiconductor die.

16. The method of claim 14, further including forming a second interconnect structure over the encapsulant and electrically connected to the recessed interconnect structure.

17. The method of claim 13, wherein the recessed interconnect structure includes a bump.

18. The method of claim 13, further including disposing a second semiconductor package over the first semiconductor package.

19. The method of claim 18, further including forming a bump over the second semiconductor package to electrically connect the second semiconductor package to the conductive ink.

* * * * *